United States Patent
Endo

(10) Patent No.: US 8,178,423 B2
(45) Date of Patent: May 15, 2012

(54) LASER BEAM MACHINING METHOD AND LASER BEAM MACHINING APPARATUS

(75) Inventor: Tomohiro Endo, Ota-ku (JP)

(73) Assignee: Disco Corporation, Tokyo (JP)

( * ) Notice: Subject to any disclaimer, the term of this patent is extended or adjusted under 35 U.S.C. 154(b) by 367 days.

(21) Appl. No.: 12/552,046

(22) Filed: Sep. 1, 2009

(65) Prior Publication Data

US 2010/0087023 A1 Apr. 8, 2010

(30) Foreign Application Priority Data

Oct. 2, 2008 (JP) .................................. 2008-257843

(51) Int. Cl.
*H01L 21/00* (2006.01)

(52) U.S. Cl. ............ 438/463; 438/460; 438/33; 438/68; 438/113; 257/E21.599; 257/E21.214; 257/E21.238

(58) Field of Classification Search .................... 438/33, 438/68, 113, 458–464, 795; 257/E21.599, 257/E21.214, E21.238
See application file for complete search history.

(56) References Cited

U.S. PATENT DOCUMENTS

| 7,977,215 | B2 * | 7/2011 | Hoshino et al. | ............... 438/464 |
| 8,048,780 | B2 * | 11/2011 | Hoshino et al. | ............... 438/463 |
| 2010/0087023 | A1 * | 4/2010 | Endo | ............................ 438/33 |

FOREIGN PATENT DOCUMENTS

| JP | A 10-305420 | 11/1998 |
| JP | A 2007-149820 | 9/2007 |

* cited by examiner

*Primary Examiner* — Jack Chen
(74) *Attorney, Agent, or Firm* — Greer, Burns & Crain, Ltd.

(57) ABSTRACT

A laser beam machining method wherein machining areas in which to form machined grooves and machining start point areas in which to form shallow grooves shallower than the machined grooves are alternately set in each of streets formed on a wafer, and the machined grooves and the shallow grooves are continuously formed by scanning an irradiation point of a laser beam along each of the streets.

6 Claims, 9 Drawing Sheets

LASER BEAM MACHINING METHOD AND LASER BEAM MACHINING APPARATUS

BACKGROUND OF THE INVENTION

1. Field of the Invention

The present invention relates to a laser beam machining method and a laser beam machining apparatus by which a transparent substrate of a wafer, having a functional layer at a surface of the transparent substrate and having devices formed in a plurality of regions demarcated by a plurality of streets formed in a grid pattern on the surface, is machined through ablation by irradiation with a laser beam.

2. Description of the Related Art

In a semiconductor device manufacturing process, a plurality of regions are demarcated by planned dividing lines called streets which are arranged in a grid pattern on a surface of a semiconductor wafer having a substantially circular plate-like shape, and devices such as ICs and LSIs are formed in the thus demarcated regions. Then, the semiconductor wafer is cut along the streets to divide the regions with the devices formed therein, whereby individual semiconductor chips are manufactured. In addition, an optical device wafer in which light emitting devices or the like such as light emitting diodes (LEDs) are layered on a surface of a sapphire substrate is also cut along streets into individual optical devices such as light emitting diodes, which are widely used in electronic apparatuses.

The cutting of the wafer along the streets as above-mentioned is ordinarily carried out by use of a cutting apparatus called dicer. The cutting apparatus includes a chuck table for holding a work such as the wafer, cutting means for cutting the work held on the chuck table, and cutting feeding means for effecting relative movement of the chuck table and the cutting means. The cutting means includes a cutting tool including a rotary spindle and a grinding blade attached to the spindle, and a driving mechanism by which the rotary spindle is driven to rotate. In such a cutting apparatus, while the cutting tool is being rotated at a rotating speed of about 20,000 to 40,000 rpm, the cutting tool and the work held on the chuck table are put into relative cutting feed. The cutting by such a cutting device, however, is disadvantageous in that the machining speed cannot be enhanced in some cases depending on the kind of the wafer and, hence, the cutting is not necessarily satisfactory in regard of productivity.

On the other hand, in recent years, as a method for dividing a wafer, in which optical devices including a nitride semiconductor or the like are layered on a surface of a sapphire substrate, along streets, there has been proposed a method in which the wafer is irradiated with a pulsed laser beam along the streets formed on the wafer to form laser beam-machined grooves and an external force is exerted on the wafer along the streets to break up the wafer along the streets (see, for example, Japanese Patent Laid-Open No. Hei 10-305420). According to the laser beam machining method described in the patent document, the laser beam-machined grooves can be formed at a comparatively high machining speed.

In the case of the laser beam machining method described in Japanese Patent Laid-Open No. Hei 10-305420, however, wall surfaces of the laser beam-machined grooves formed along the streets have been melted and are rough, which causes a problem that where the individual devices divided up from the wafer are light emitting diodes (LEDs), the LEDs exhibit lowered luminance. For overcoming this problem, a machining method has been proposed in which the machined grooves are formed in the shape of broken lines (see, for example, Japanese Patent Laid-Open No. 2007-149820). According to this laid-open patent document, the machined grooves are formed in the shape of broken lines, whereby the once-melted layers at side surfaces of the devices can be reduced in area, and the lowering in luminance can be suppressed to a slight extent.

In the case of the laser beam machining method described in Japanese Patent Laid-Open No. 2007-149820, however, an unmachined area where no machined groove is formed (omission of the machined groove) may be generated in the portions irradiated with the laser beam for the purpose of forming the machined grooves. FIG. 11 is an electron microphotograph showing a situation in which omission of the machined groove as just-mentioned has been generated. Generation of the unmachined area where no machined groove is formed would not only lower the dividability of the wafer but also cause damage to the device layer through a process in which the laser beam not absorbed into the sapphire substrate is radiated to the device layer.

SUMMARY OF THE INVENTION

Accordingly, it is an object of the present invention to provide a laser beam machining method and a laser beam machining apparatus by which it is possible to reduce the area of once-melted layers at sections of semiconductor chips and to minimize the lowering in quality of the chips, while securely forming machined grooves sufficient for dividing a transparent substrate such as a sapphire substrate.

In accordance with an aspect of the present invention, there is provided a laser beam machining method for machining a transparent substrate of a wafer through ablation by irradiation with a laser beam, the wafer having a functional layer formed on a surface of the transparent substrate and having devices formed respectively in a plurality of regions demarcated by a plurality of streets arranged in a grid pattern on the surface, the method including: a holding step of holding the wafer; a setting step of alternately setting in each of the streets machining areas in which to form machined grooves and machining start point areas in which to form shallow grooves shallower than the machined grooves, and storing the setting information in a storage section; and a machining step of continuously forming the machined grooves and the shallow grooves by scanning an irradiation point of the laser beam from one end toward the other end of each of the streets, based on the setting information stored in the storage section.

Preferably, the machining step includes continuously forming the machined grooves and the shallow grooves by scanning the irradiation point of the laser beam from one end toward the other end of each of the streets while varying the output power of the laser beam. Preferably, the transparent substrate includes a sapphire substrate, the functional layer includes a nitride semiconductor layer, and the device is a light emitting diode.

Preferably, the machining areas are set in areas each including an intersection position of the plurality of streets arranged in the grid pattern. The ratio of the length of the machining area to the length of the machining start point area is preferably set in the range of from 1:1 to 2:1. The depth of the machined grooves is preferably set in the range of 15 to 25 μm.

In accordance with another aspect of the present invention, there is provided a laser beam machining apparatus including: holding means for holding a wafer having a functional layer formed on a surface of a transparent substrate and having devices formed respectively in a plurality of regions demarcated by a plurality of streets arranged in a grid pattern on the surface; machining means for machining the transparent substrate of the wafer held on the holding means through ablation by irradiation with a laser beam; and control means for alternately setting in each of the streets machining areas in which to form machined grooves and machining start point areas in which to form shallow grooves shallower than the machined grooves, and controlling the machining means so as to continuously form the machined grooves and the shallow grooves by scanning an irradiation point of the laser beam from one end toward the other end of each of the streets.

Preferably, the control means controls the machining means so as to continuously form the machined grooves and the shallow grooves by scanning the irradiation point of the laser beam from one end toward the other end of each of the streets while varying the output power of the laser beam.

In accordance with a further aspect of the present invention, there is provided a method of manufacturing a chip having a rugged pattern including a once-melted layer at a section thereof, the method including: a holding step of holding a wafer having a functional layer formed on a surface of a transparent substrate and having devices formed respectively in a plurality of regions demarcated by a plurality of streets arranged in a grid pattern on the surface; a setting step of alternately setting in each of the streets machining areas in which to form machined grooves and machining start point areas in which to form shallow grooves shallower than the machined grooves, and storing the setting information in a storage section; a machining step of continuously forming the machined grooves and the shallow grooves in the transparent substrate by scanning an irradiation point of a laser beam for ablation machining from one end toward the other end of each of the streets, based on the setting information stored in the storage section; and a dividing step of exerting an external force on the wafer along the streets so as to divide the wafer into chips on a device basis.

The present inventors investigated the reason why the above-mentioned unmachined area is left, and, as a result of the investigations, they found out the following. The machining through absorption of a laser beam is not started by only irradiating the transparent substrate such as a sapphire substrate with the laser beam. Instead, some trigger or other is needed for the starting of the machining. Specifically, a tiny foreign matter such as dust on the substrate, a tiny flaw in the substrate or the like can trigger the starting of the machining. Based on the finding, according to the present invention, machining areas in which to form machined grooves and machining start point areas in which to form shallow grooves shallower than the machined grooves are alternately set in each of the streets, and the machined grooves and the shallow grooves are formed by scanning an irradiation point of a laser beam along each of the streets. Therefore, due to the presence of the machining start point areas with the shallow grooves, the machined grooves can be formed assuredly. Consequently, damage on the device layer side by the laser beam can be obviated, while securing satisfactory dividability.

Meanwhile, each of the devices divided individually from the wafer by breaking-up of the wafer along the streets has a structure in which a once-melted layer formed by irradiation with the laser beam is left at upper parts of side surfaces of each device. However, the once-melted layer is small, as compared with the area of the side surface of the device. Therefore, even where the device is a light emitting diode (LED), the lowering in the luminance of the device due to the once-melted layer is slight, and the once-melted layer does not influence the quality of the device.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
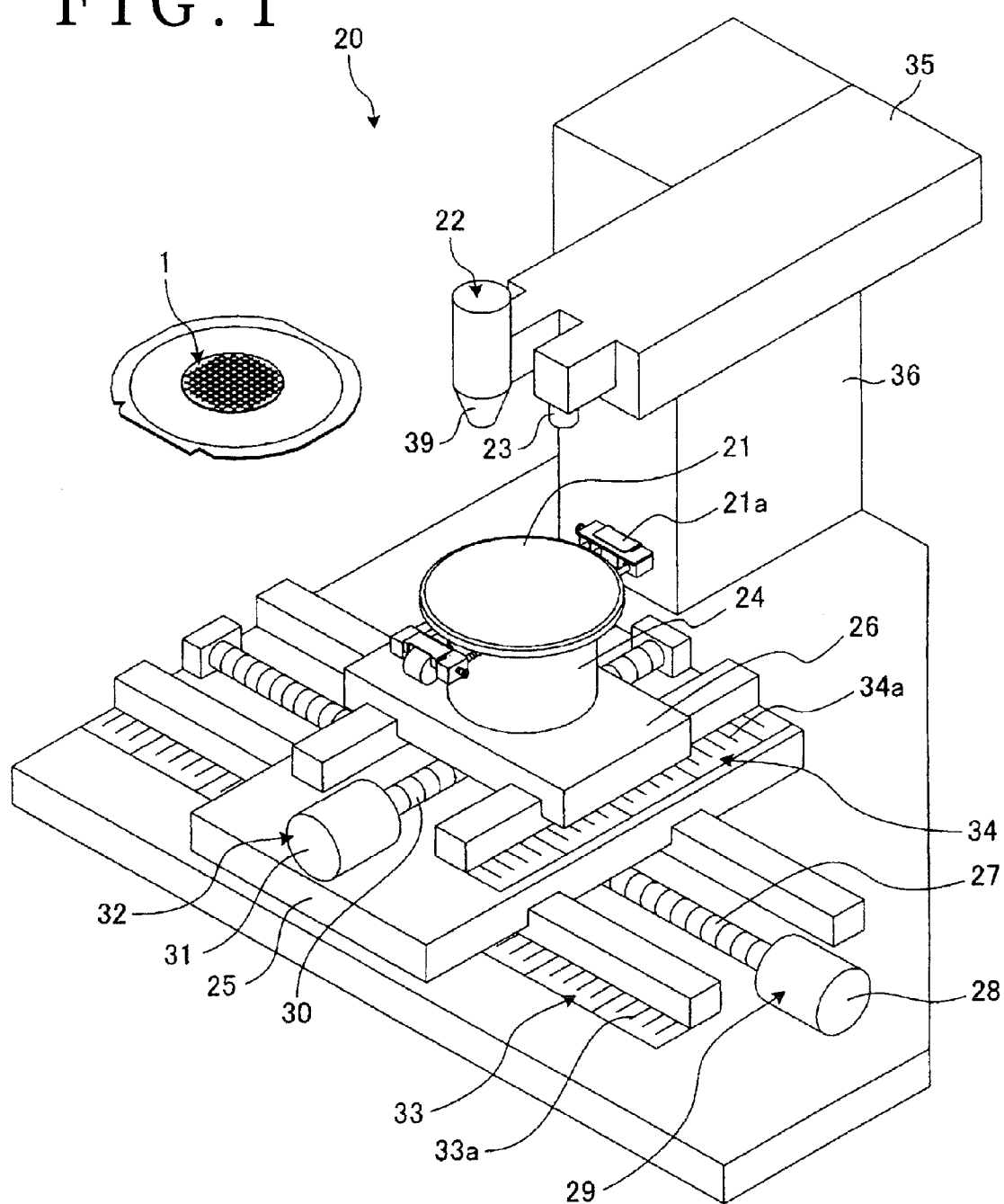
FIG. 1 is a perspective view showing a major part of a laser beam machining apparatus according to an embodiment of the present invention.

Now, a laser beam machining apparatus, a laser beam machining method and a chip manufacturing method including the laser beam machining method, which correspond to a best mode for carrying out the present invention, will be described below referring to the drawings. The present embodiment shows an exemplary application of the invention to a case where a transparent substrate of a wafer, having a functional layer formed at a surface of the transparent substrate and having devices formed in a plurality of regions demarcated by a plurality of streets arranged in a grid pattern on the surface, is machined through ablation by irradiation with a laser beam.

Figure 2:
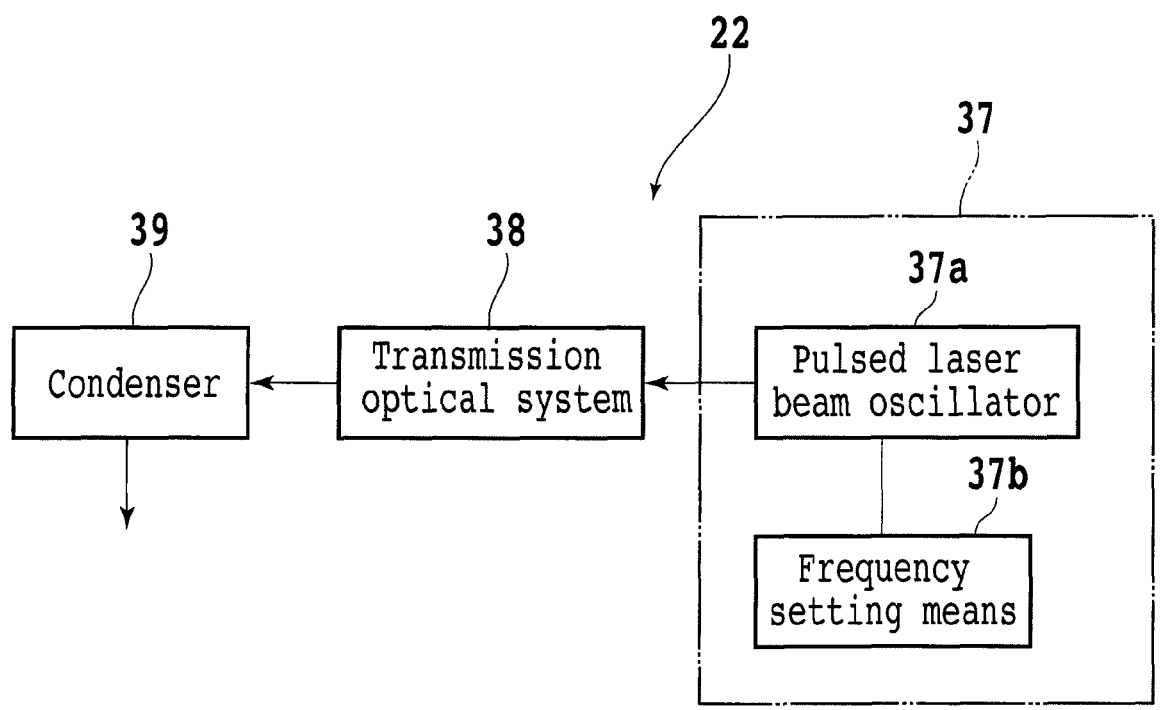
FIG. 2 is a general block diagram showing a configuration example of machining means.

FIG. 1 is a perspective view of a major part of a laser beam machining apparatus according to the present embodiment, and FIG. 2 is a general block diagram showing a configuration example of machining means. The laser beam machining apparatus 20 in this embodiment includes holding means 21 for holding a wafer 1, machining means 22 for machining the wafer 1 held on the holding means 21 through ablation by irradiating the wafer 1 with a pulsed laser beam, and image pickup means 23 for picking up an image of the wafer 1 held on the holding means 21. In addition, the holding means 21 holds the wafer 1 by suction, and is connected to a motor (not shown) inside a cylindrical section 24 so as to be rotatable.

Besides, the holding means 21 is mounted on a two-stage arrangement of slide blocks 25 and 26. The holding means 21 is provided in such a relation with the slide block 25 that it can be moved in an X-axis direction, which is a horizontal direction, by a machining feeding means 29 composed of a ball screw 27, a nut (not shown), a pulse motor 28 and the like, whereby the wafer 1 mounted thereon is put into machining feed relative to the pulsed laser beam radiated by the machining means 22. Similarly, the holding means 21 is provided in such a relation with the slide block 26 that it can be moved in a Y-axis direction, which is a horizontal direction, by indexing feeding means 32 composed of a ball screw 30, a nut (not shown), a pulse motor 31 and the like, whereby the wafer 1 mounted thereon is put into indexing feed relative to the pulsed laser beam radiated by the machining means 22.

Here, for the machining feeding means 29, machining feed amount detection means 33 for detecting the machining feed amount of the holding means 21 is additionally provided. The machining feed amount detection means 33 is composed of a linear scale 33a arranged along the X-axis direction, and a reading head (not shown) which is arranged on the slide block 25 and which is moved along the linear scale 33a together with the slide block 25. The feed amount detection means 33 sends a pulse signal, which for example has one pulse per 1-μm feed, to the control means (described later), thereby permitting the control means to count the pulses in the pulse signal inputted and thereby to detect the machining feed amount of the holding means 21.

Similarly, for the indexing feeding means 32, indexing feed amount detection means 34 for detecting the indexing feed amount of the holding means 21 is additionally provided. The indexing feed amount detection means 34 is composed of a linear scale 34a arranged along the Y-axis direction, and a reading head (not shown) which is arranged on the slide block 26 and which is moved along the linear scale 34a together with the slide block 26. The indexing feed amount detection means 34 sends a pulse signal, which for example has one pulse per 1-μm feed, to the control means (described later), thereby permitting the control means to count the pulses in the pulse signal inputted and thereby to detect the indexing feed amount of the holding means 21.

In addition, the machining means 22 includes a casing 35 arranged substantially horizontally, and is so provided that it can be moved relative to a support block 36 in a Z-axis direction by Z-axis moving means (not shown) through the casing 35. As shown in FIG. 2, the machining means 22 includes pulsed laser beam oscillating means 37 and a transmission optical system 38 which are arranged inside the casing 35, and a condenser 39 which is arranged at the tip of the casing 35 and by which the pulsed laser beam oscillated by the pulsed laser beam oscillating means 37 is radiated to the wafer 1 held on the holding means 21. The pulsed laser beam oscillating means 37 is composed of a pulsed laser beam oscillator 37a including a YAG laser oscillator or a YVO4 laser oscillator, and repetition frequency setting means 37b added thereto. The transmission optical system 38 includes an adequate optical element such as a beam splitter. The pulsed laser beam oscillator 37a and the Q switch 37b are controlled by the control means which will be described later. In the condenser 39, a condenser lens (not shown) having a known configuration including a lens set or the like is contained.

Besides, the image pickup means 23 attached to a tip part of the casing 35 is means for picking up an image of an upper surface of the wafer 1 held on the holding means 21, so as to detect an area to be machined by the pulsed laser beam radiated through the condenser 39 of the machining means 22. The image pickup means 23 is composed of an image sensor (CCD) for picking up an image by use of visible rays or the like device, and sends a picture signal of the picked-up image to the control means (described later).

Figure 3:
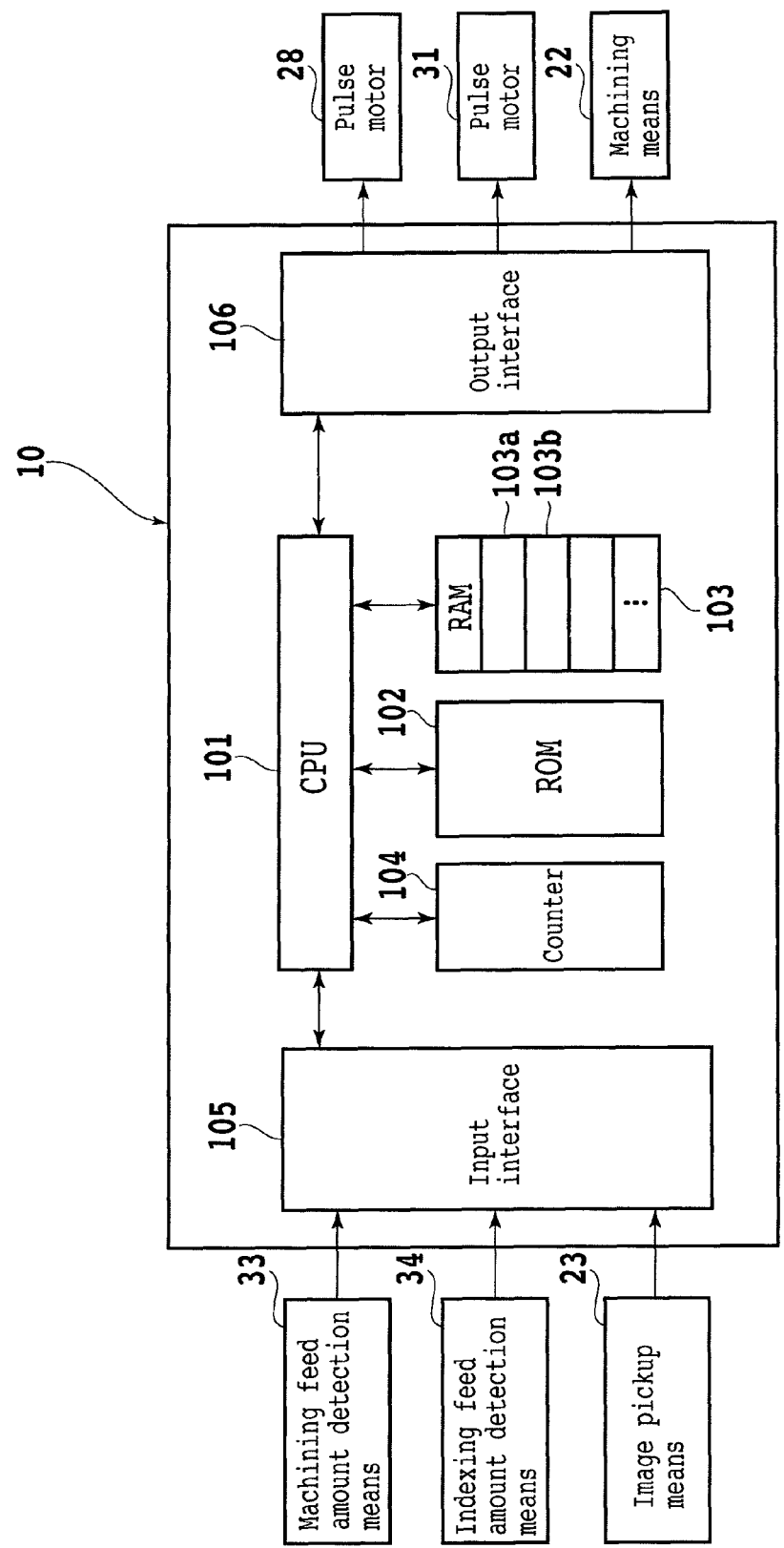
FIG. 3 is a general block diagram showing a configuration example of control means.

In addition, the laser beam machining apparatus 20 in this embodiment has the control means 10, as shown in FIG. 3. FIG. 3 is a general block diagram showing a configuration example of the control means. The control means 10 is composed of a microcomputer, including a central processing unit (CPU) 101 for executing arithmetic operations according to a control program, a read only memory (ROM) 102 for storing the control program and the like, a writable/readable random access memory (RAM) 103 for storing setting information on machining areas and machining starting point areas (described later), set on the basis of the X and Y coordinates of the start points, end points and intersections of the streets, etc. for irradiating the wafer 1 with the pulsed laser beam, the results of arithmetic operations and so on, a counter 104, an input interface 105 and an output interface 106. To the input interface 105 of the control means 10 are inputted detection signals from the feed amount detection means 33 and 34, the image pickup means 23 and the like. From the output interface 106 of the control means 10, on the other hand, control signals are outputted to the pulse motors 28 and 31, the machining means 22 and the like.

Figure 4:
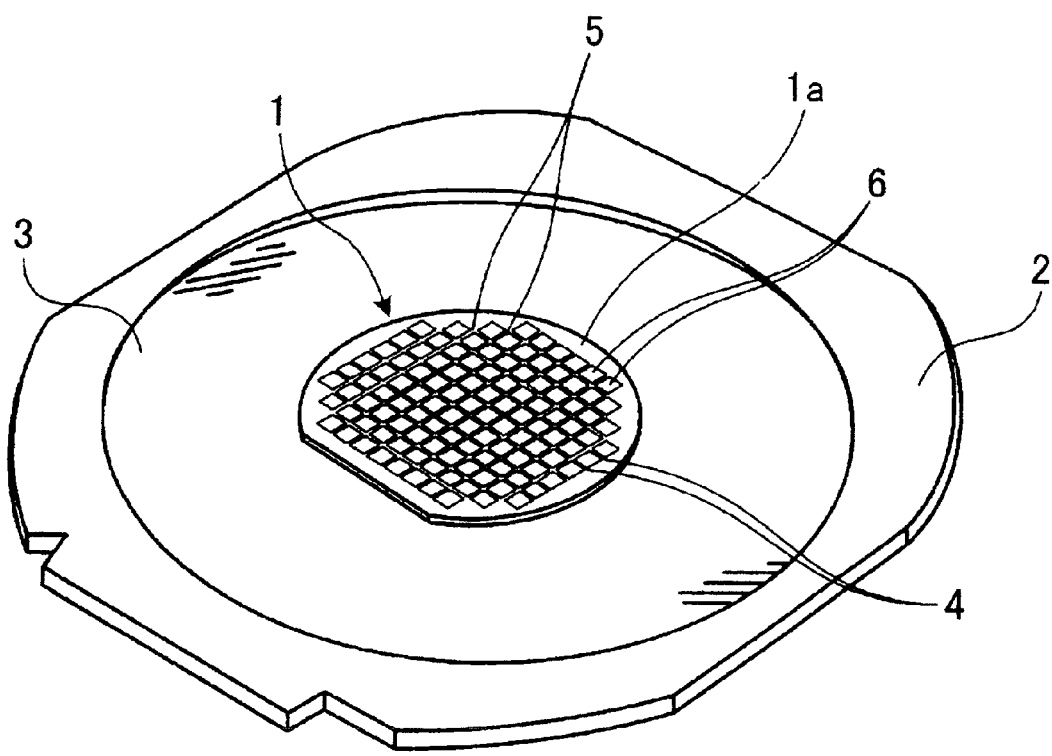
FIG. 4 is a perspective view of a wafer.

Now, the laser beam machining method for machining a wafer 1 by use of the above-mentioned laser beam machining apparatus 20 will be described below. FIG. 4 is a perspective view of a wafer. The wafer 1 is prepared in the state of being adhered, with its face-side surface 1a up, to a protective tape 3 which is composed of a sheet of a synthetic resin such as polyolefin and which is mounted to an annular frame 2. The wafer 1 has a structure in which a functional layer is formed at a surface of a transparent substrate and devices are formed in a plurality of regions formed by a plurality of streets arranged in a grid pattern on the surface. Specifically, a functional layer composed of a nitride semiconductor layer is formed at a surface of a sapphire substrate having a thickness of 90 μm, for example. The face-side surface 1a of the wafer 1 is formed with a plurality of rectangular regions demarcated by a plurality of first streets 4 and a plurality of second streets 5 which are arranged in a grid pattern, and devices 6 composed of light emitting diodes (LEDs) are formed respectively in the plurality of rectangular regions. Here, the transparent substrate constituting the substrate of the wafer 1 means a substrate having such properties that rays with wavelengths in at least part of visible light are transmitted therethrough. Examples of the transparent substrate include, in addition to the sapphire substrate in this embodiment, those substrates which are formed of quartz glass, lithium tantalate or the like.

As shown in FIG. 4, the wafer 1 supported on the annular frame 2 through the protective tape 3 is mounted on the holding means 21 of the laser beam machining apparatus 20 shown in FIG. 1, with the protective tape 3 side set on the holding means 21 side. Then, suction means (not shown) is operated, whereby the wafer 1 is suction held onto the holding means 21 through the protective tape 3 (holding step). Incidentally, the annular frame 2 is fixed by clamps 21a.

The holding means 21 with the wafer 1 suction held thereon is positioned into a position just under the image pickup means 23 by the machining feeding means 29. After the holding means 21 is positioned in the position just under the image pickup means 23, an alignment work for detecting an area to be laser beam machined of the wafer 1 is carried out by the image pickup means 23 and the control means 10. Specifically, the image pickup means 23 and the control means 10 perform image processings such as pattern matching for positional matching between the first street 4 formed on the wafer 1 in a predetermined direction and the condenser 39 of the machining means 22 for irradiating the wafer 1 with the laser beam along the first street 4, thereby achieving alignment of a laser beam irradiation position. In addition, in relation to the second street 5 formed on the wafer 1, also, alignment of the laser beam irradiation position is carried out similarly.

Figure 5A:
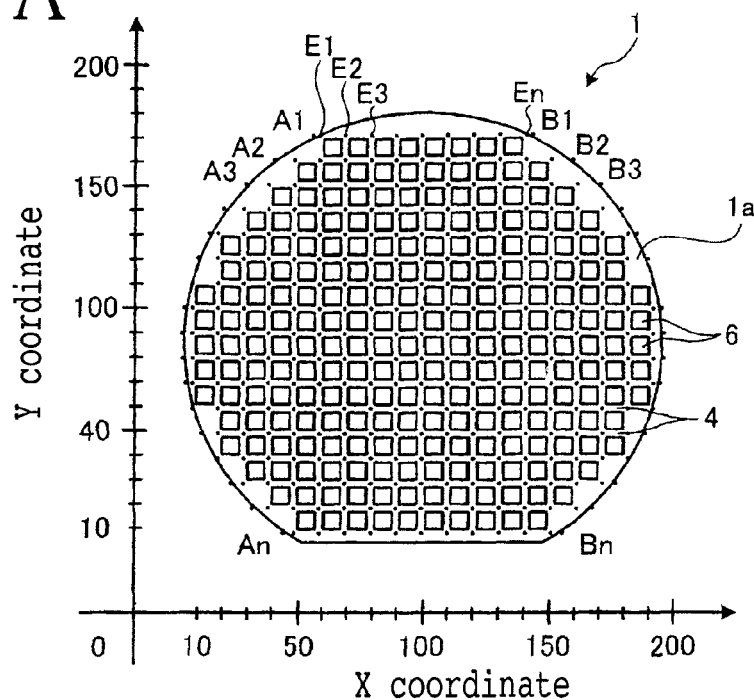
FIGS. 5A and 5B each illustrate the relationship of the wafer, in the state of being held by holding means, with coordinate positions.
Figure 5B:
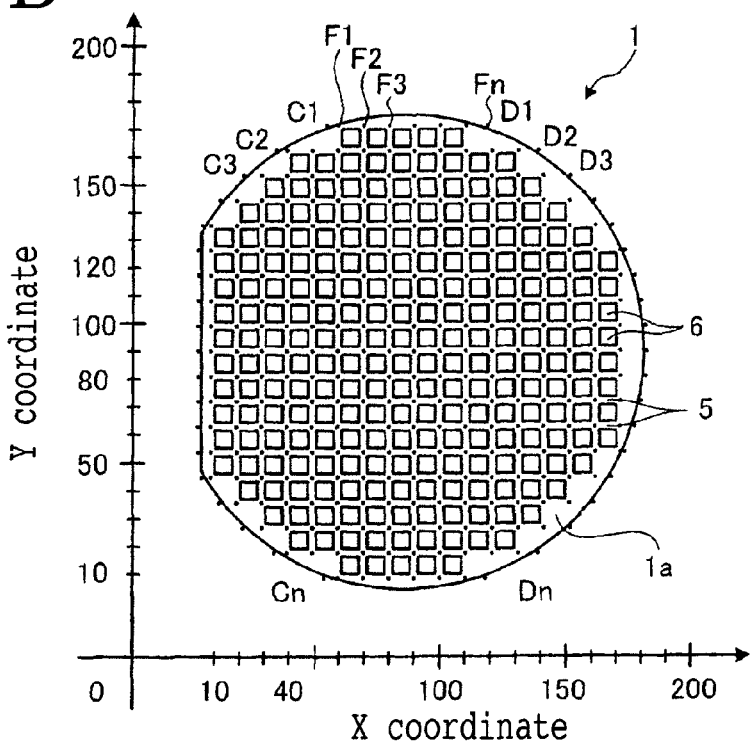
Figure 6:
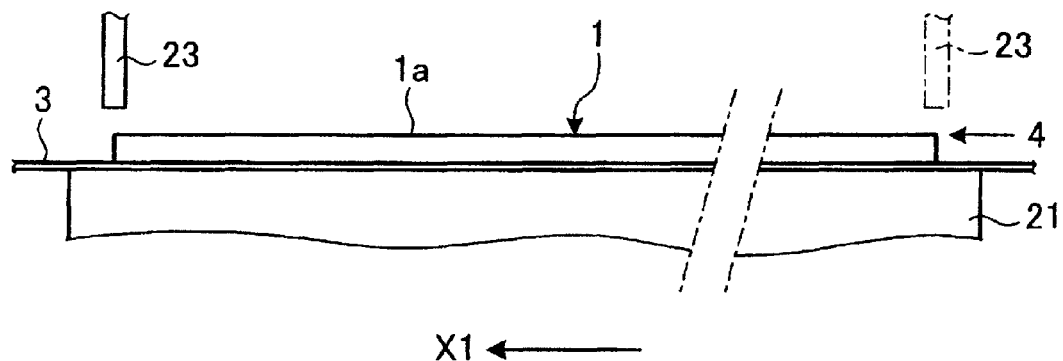
FIG. 6 illustrates a street detection step.
Figure 7:
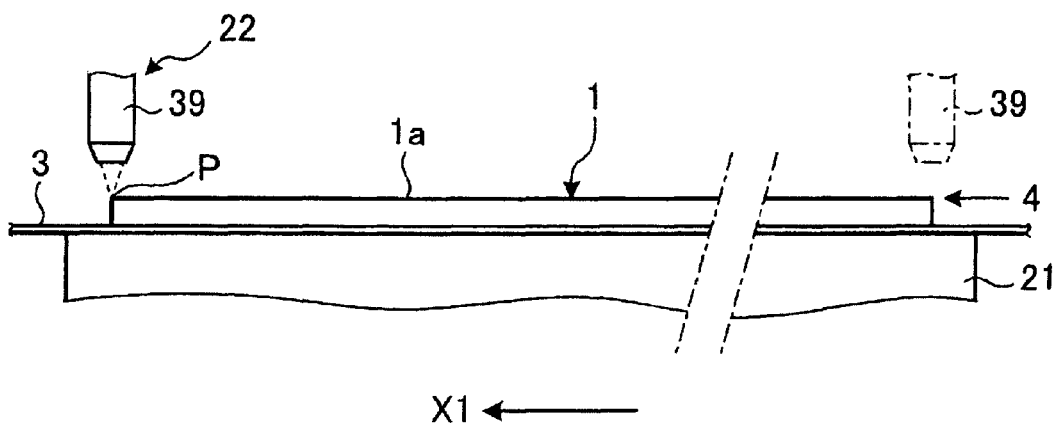
FIG. 7 illustrates a starting time and a finishing time of a machining step.
Figure 8:
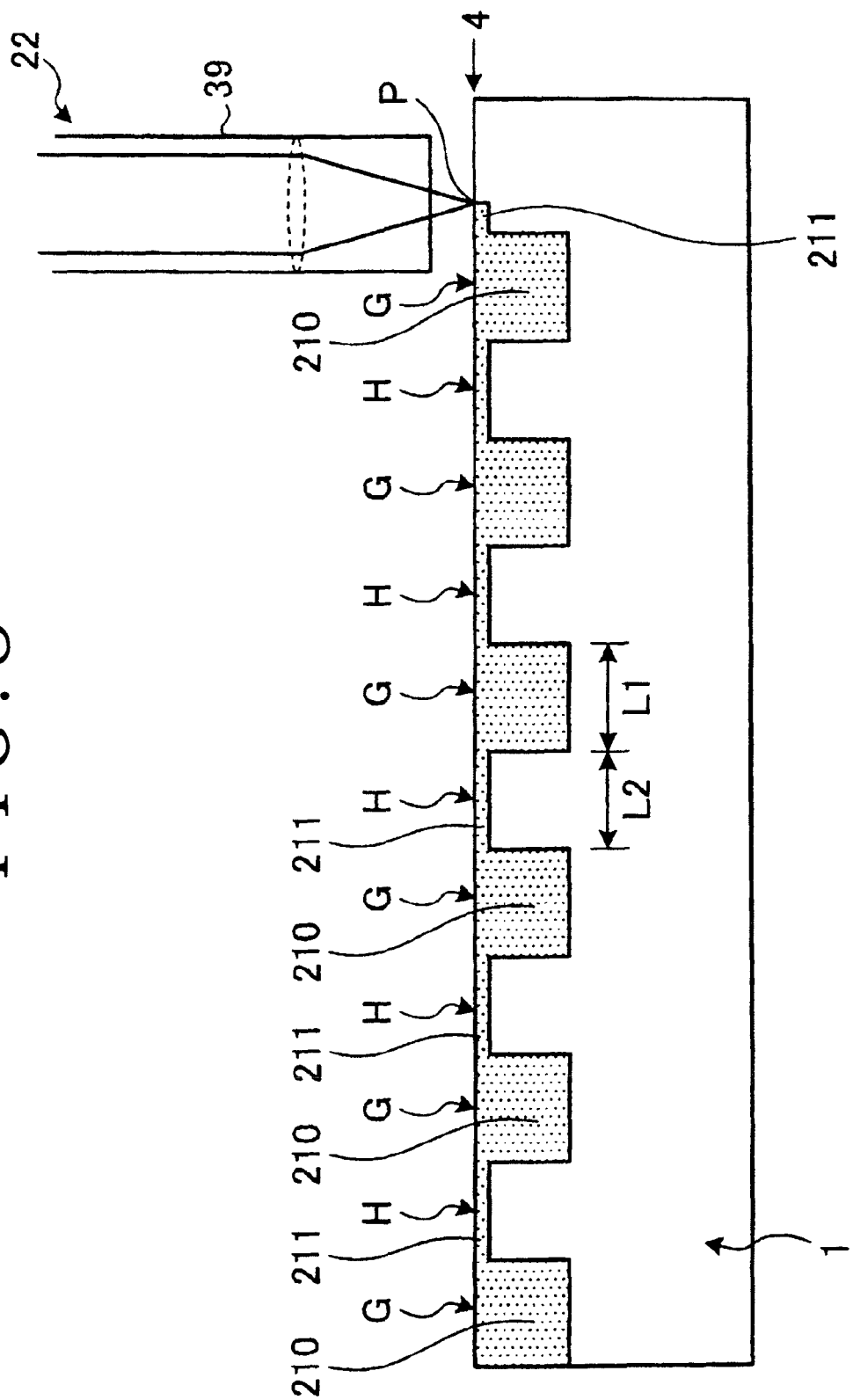
FIG. 8 illustrates a step of forming machined grooves and shallow grooves.

FIGS. 5A and 5B each illustrate the relationship of the wafer, in the state of being held on the holding means, with coordinate positions; FIG. 6 illustrates a street detecting step; FIG. 7 illustrates a starting time and a finishing time of a machining step; and FIG. 8 illustrates a step of forming machined grooves and shallow grooves. The above-mentioned alignment results in that the wafer 1 on the holding means 21 is in the state of being positioned at coordinate positions shown in FIG. 5A. Incidentally, FIG. 5B shows the condition attained by 90° rotation of the holding means 21, and hence the wafer 1, from the condition shown in FIG. 5A.

After the first and second streets 4 and 5 formed on the wafer 1 held on the holding means 21 are detected and the alignment of the laser beam irradiation position is performed as above-mentioned, the holding means 21 is moved so that the uppermost first street 4 of the first streets 4 in the condition shown in FIG. 5A is positioned into a position just under the image pickup means 23. Furthermore, as shown in FIG. 6, one end (the left end in FIG. 6) of the first street 4 is positioned into the position just under the image pickup means 23. When the one end (the left end in FIG. 6) of the first street 4 is detected by the image pickup means 23 under this condition, its coordinates (A1 in FIG. 5A) are sent to the control means 10 as machining feed start position coordinates.

Next, the holding means 21 is moved in the direction of arrow X1 in FIG. 6 so that the other end (the right end in FIG. 6) of the first street 4 is positioned into the position just under the image pickup means 23. During this operation, the image pickup means 23 detects the coordinates (E1, E2, E3, . . . , En) of the intersections of the first street 4 with the second streets 5 and the coordinates (B1) of the other end (the right end in FIG. 5A) of the first street 4 as shown in FIG. 5A, and sends the thus detected coordinates to the control means 10 as intersection coordinates and machining feed end position coordinates. The control means 10 temporarily stores the thus inputted machining feed start position coordinates (A1), intersection coordinates (E1, E2, E3, . . . , En) and machining feed end position coordinates (B1) of the first street 4 in a storage area 103a in the RAM 103 (street detecting step).

After the machining feed start position coordinates, intersection coordinates and machining feed end position coordinates of the uppermost first street 4 in FIG. 5A are detected in this manner, index feeding of the holding means 21 in the direction of arrow Y and by the interval of the first streets 4 is conducted so that the second uppermost first street 4 in FIG. 5A is positioned into the position just under the image pickup means 23. Then, the above-mentioned street detecting step is carried out for the second uppermost first street 4 so as to detect the machining feed start position coordinates (A2), intersection coordinates (E1, E2, E3, . . . , En) and machining feed end position coordinates (B2) of the second uppermost first street 4, and these coordinates are temporarily stored in the storage area 103a in the RAM 103.

Thereafter, the indexing feeding and the street detecting step as above-mentioned are repeated until those for the lowermost first street 4 in FIG. 5A are finished, so as to detect the machining feed start position coordinates (A3 to An), intersection coordinates (E1, E2, E3, . . . , En) and machining feed end position coordinates (B3 to Bn) for the first streets 4, and these coordinates are temporarily stored in the storage area 103a in the RAM 103.

After the street detecting step for the first streets 4 is completed in the above-mentioned manner, the holding means 21, hence the wafer 1, is rotated by 90°, to be positioned into the state shown in FIG. 5B. Next, the above-mentioned street detecting step is carried out for each of the second streets 5 so as to detect the machining feed start position coordinates (C1 to Cn), intersection coordinates (F1, F2, F3, . . . , Fn) and machining feed end position coordinates (D1 to Dn) for the second streets 5, and these coordinates are temporarily stored in the storage area 103a in the RAM 103.

Incidentally, a configuration may be adopted in which the machining feed start position coordinates (A1 to An), intersection coordinates (E1, E2, E3, . . . , En) and machining feed end position coordinates (B1 to Bn) for the first streets 4 formed on the wafer 1 as well as the machining feed start position coordinates (C1 to Cn), intersection coordinates (F1, F2, F3, . . . , Fn) and machining feed end position coordinates (D1 to Dn) for the second streets 5 are provided by preliminarily storing them in the ROM 102 or the RAM 103, and in which the above-mentioned street detecting step is omitted.

Subsequently, the control means 10, by referring to the coordinates of the machining feed start positions, intersections and machining feed end positions obtained in the above-mentioned street detecting step and stored in the storage area 103a, sets information on irradiation times (or feed length, etc.) and pulsed laser beam outputs for machining areas in which to form the machined grooves and machining start point areas in which to form the shallow grooves shallower than the machined grooves on the basis of each of the streets 4 and 5 and under predetermined machining conditions, and stores the setting information in a storage area 103b in the RAM 103 (setting step). Here, the control means 10 sets the laser irradiation times for the machining areas and the machining start point areas so that, for example, the length of the machining area will be 200 μm and the length of the machining start point area will be 100 μm in each of the streets 4 and 5.

After the setting step as above, a machining step is conducted in which the point of irradiation with the laser beam by the machining means 22 is scanned from one end toward the other end of each of the streets 4 and 5 on the basis of the setting information on the machining feed start position, the irradiation times for the machining area and the machining start point area, the output of the pulsed laser beam, the machining feed end position, etc. stored in the storage area 103b, whereby the machined grooves and the shallow grooves are formed in a continuous manner.

In performing the machining step, first, the holding means 21 is moved so that the uppermost first street 4 in FIG. 5A is positioned into a position just under the condenser 53 of the machining means 52. Then, further, as shown in FIG. 7, the machining feed start position coordinates (A1) (see FIG. 5A) corresponding to one end (the left end in FIG. 7) of the first street 4 are positioned into the position just under the condenser 53. In this instance, the irradiation point P of the pulsed laser beam is adjust to a position near the face-side surface 1a (upper surface) of the wafer 1.

Then, while machining feed of the holding means 21, and hence the wafer 1, in the direction of arrow X1 in FIG. 7 is being conducted, the transparent substrate of the wafer 1 is irradiated with the pulsed laser beam through the condenser 39. In this case, based on the setting information on the irradiation times and the pulsed laser beam outputs for the machining area and the machining start point area which are stored in the storage area 103b, the control means 10 causes the irradiation point P to be continuously scanned while alternately varying the output of the laser beam outputted from the pulsed laser beam oscillator 37a so that the laser beam output will be higher in the machining areas and lower in the machining start point areas. When the other end (the right end in FIG. 7) of the first street 4, namely, the machining feed end position coordinates (B1) have reached the irradiation position of the condenser 39 of the machining means 22, the irradiation with the pulsed laser beam is stopped and the machining feed of the holding means 21, and hence the wafer 1, is stopped.

As a result, as shown in FIG. 8, along the first street 4, the machined grooves 210 are formed in the machining areas G irradiated with a higher-output pulsed laser beam, whereas the shallow grooves 211 shallower than the machined grooves 210 are formed in the machining start point areas H irradiated with a lower-output pulsed laser beam. Therefore, in the transparent substrate, the machined grooves 210 in the machining areas G and the shallow grooves 211 in the machining start point areas H are alternately formed along the first street 4. In this case, the shallow grooves 211 and the machined grooves 210 are continuously formed by irradiation with the laser beam, and the machined grooves 210 can be formed assuredly in the manner of being triggered by the presence of the shallow grooves 211.

Here, the depth of the machined grooves 210 formed in the machining areas G and the depth of the shallow grooves 211 formed in the machining start point areas H will be described. As the depth of the machined grooves 210 formed in the machining areas G is larger, the break-up of the wafer 1 along the machined grooves 210 is easier, but the devices obtained will show lowered luminance. On the other hand, as the depth of the machined grooves 210 is smaller, the lowering in the luminance exhibited by the devices 6 is slighter, but the break-up of the wafer 1 along the laser beam machined grooves 210 in the transparent substrate will be more difficult. Therefore, in order to suppress the lowering in the luminance of the optical devices 203 and to facilitate the break-up of the optical device wafer 1 along the laser beam machined grooves 210, an appropriate depth of the machined grooves 210 is 15 to 25 µm in the case where the thickness of the wafer 1 is around 100 µm. As for the depth of the shallow grooves 211 formed in the machining start point areas H, the depth of each shallow groove 211 may have any value insofar as the shallow groove 211 can trigger the starting of machining, by irradiation with the laser beam, of the machined groove 210 continuously formed following to the shallow groove 211; thus, an appropriate depth of the shallow grooves 211 is about 5 to 8 µm.

In addition, as for the relationship between the length L1 of each machining area G and the length L2 of each machining start point area H, the following can be said. As the proportion of the length L1 of the machining area G is higher, the break-up of the wafer 1 along the machined grooves 210 is easier, but the luminance of the devices 6 is lower. On the other hand, as the proportion of the length L2 of the machining start area H is higher, the lowering in the luminance of the devices 6 is slighter, but the break-up of the wafer 1 along the machined grooves 210 is more difficult. Accordingly, in order to suppress the lowering in the luminance of the devices 203 and to facilitate the break-up of the wafer 1 along the machined grooves 210, the ratio of the length L1 of the machined area G to the length L2 of the machining start point area H is appropriately in the range L1:L2=1:1 to 2:1.

Now, an example of the material and size of the wafer 1 subjected to the above-mentioned machining step and an example of machining conditions in the machining step will be described below.

(1) Material and Size of Wafer 1
  Transparent substrate: sapphire substrate
  Functional layer laminated: GaN film
  Size of wafer 1: 50 mm in diameter
  Thickness of wafer 1: 90 µm
  Size of device 6: 300 µm×300 µm
(2) Machining Conditions
  Light source: YAG laser
  Wavelength: 355 nm
  Converging spot diameter: φ5 µm
  Repetition frequency: 80 kHz
  Machining feed rate: 40 mm/s
  Machining area average output: 0.8 W
  Machining start point area average output: 0.4 W Description will now be made of an example of the machining method for the case where the length L1 of the machining area G is set to 200 µm and the length L2 of the machining start point area H is set to 100 µm. When the machining feed rate is 40 mm/s as above-mentioned, the time required for movement through the 200-µm machining area G is 0.005 second, and the time required for movement through the 100-µm machining start point area H is 0.0025 second. Therefore, by repeating an operation of irradiating with the pulsed laser beam at an output of 0.8 W for 0.005 second and thereafter irradiating with the pulsed laser beam at an output of 0.4 W for 0.0025 second, machined grooves 210 with a length of 200 µm and shallow grooves 211 with a length of 100 µm can be formed along the street. Incidentally, under the above-mentioned machining conditions, the depth of the machined grooves 210 is about 25 µm and the depth of the shallow grooves 211 is about 7 µm.

After the machining step is applied to the uppermost first street 4 in FIG. 5A which is formed on the wafer 1 in the above-mentioned manner, indexing feed of the holding means 21 in the direction of arrow Y in FIG. 1 and by the interval of the first streets 4 is conducted, and the machining step is applied to the next street 4. After the machining steps for all the first streets 4 extending in the predetermined direction of the wafer 1 are finished, the holding means 21, hence the wafer 1 held thereon, is turned by 90 degrees, and the machining step is similarly carried out along the second streets 5 formed in the direction orthogonal to the first streets 4. As a result, along all the first and second streets 4 and 5 on the wafer 1, the machined grooves 210 are formed in the machining areas G, whereas the shallow grooves 211 are formed in the machining start point areas H, and the machined grooves 210 and the shallow grooves 211 are formed alternately.

Figure 9:
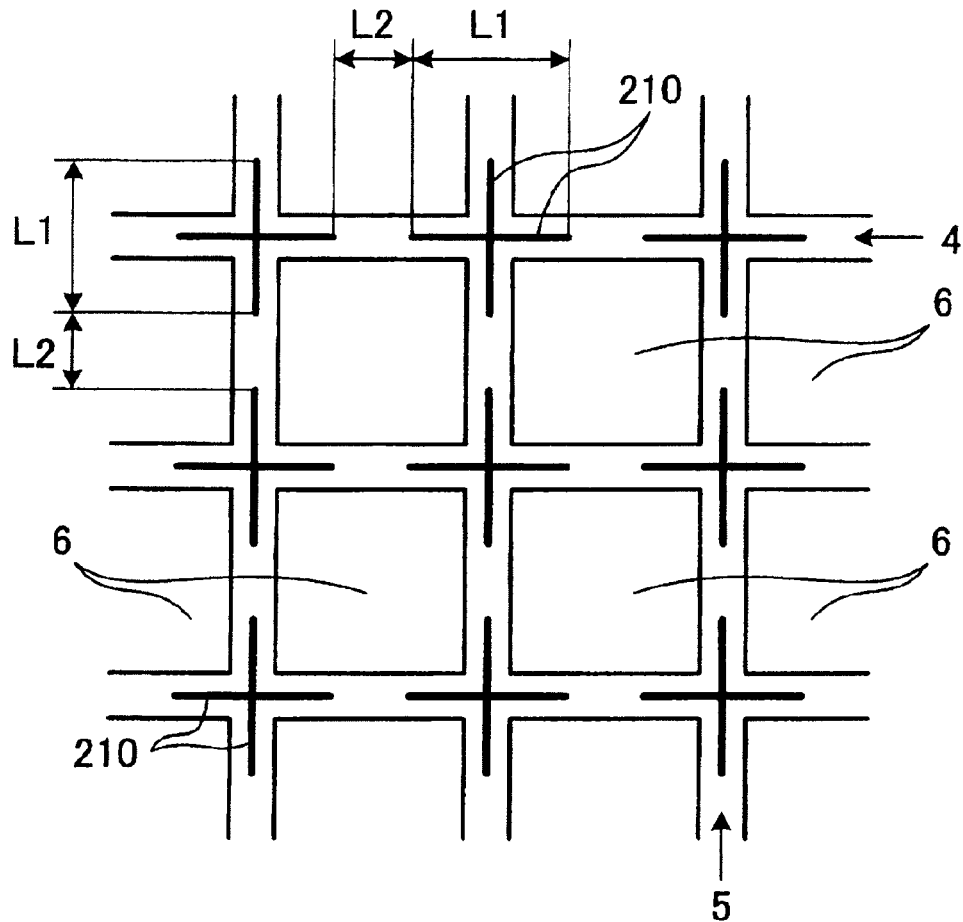
FIG. 9 illustrates a condition where areas including the intersections of streets are set as machining areas.

The machined grooves 210 formed in the machining areas G in the above-mentioned machining step are desirably formed in the areas including the intersection positions of the first and second streets 4 and 5, as shown in FIG. 9. FIG. 9 illustrates the condition where the machined grooves are formed under such a setting that areas including the intersections of the streets are set as the machining areas. In order that the areas including the intersections of the first and second streets 4 and 5 are set as the machining areas G and the machining areas G are irradiated with the pulsed laser beam, it suffices to control the machining means 22 on the basis of the detection signal from the machining feed amount detection means 33 and the data of the intersection coordinates stored in the storage area 103a in the RAM 103 of the control means 10. Incidentally, in FIG. 9, the portions of the machined grooves 210 are shown while omitting the portions of the shallow grooves 211, for easy understanding.

More specifically, in the case where the length of each machining area G is set to 200 µm and the length of each machining start point area H is set to 100 µm for the wafer 1 with the size of the devices 6 being 300 µm×300 µm as above-mentioned, irradiation with the higher-output pulsed laser beam for the machining areas G is conducted over the range from a position deviated backwards by 100 µm from an intersection of the first and second streets 4 and 5 to a position deviated forwards by 100 µm from the intersection, based on the detection signal from the machining feed amount detection means 33. As a result, the machined grooves 210 with a length of 200 µm are formed along the first and second streets 4 and 5 in the machining areas G including the intersections, and the machined grooves 210 having a length of 200 μm and the shallow grooves 211 having a length of 100 μm are formed alternately.

The wafer 1 having undergone the machining step in the above-mentioned manner is fed to the next step, namely, a dividing step. In the dividing step, an external force is exerted on the wafer 1 along each broken line composed of the machined grooves 210 formed in the machining areas G and the shallow grooves 211 formed in the machining start point areas H, of the first and second streets 4 and 5. Consequently, the machined grooves 210 each function as a starting point of breakage, and the breakage is propagated along the shallow grooves 211, so that the wafer 1 is securely broken up along the first and second streets 4 and 5.

Figure 10:
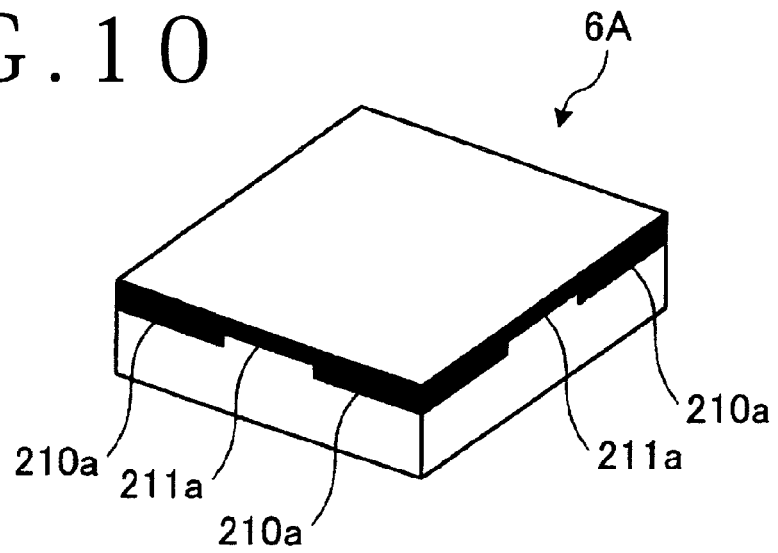
FIG. 10 is a perspective view of a chip formed by dividing the wafer.
Figure 11:
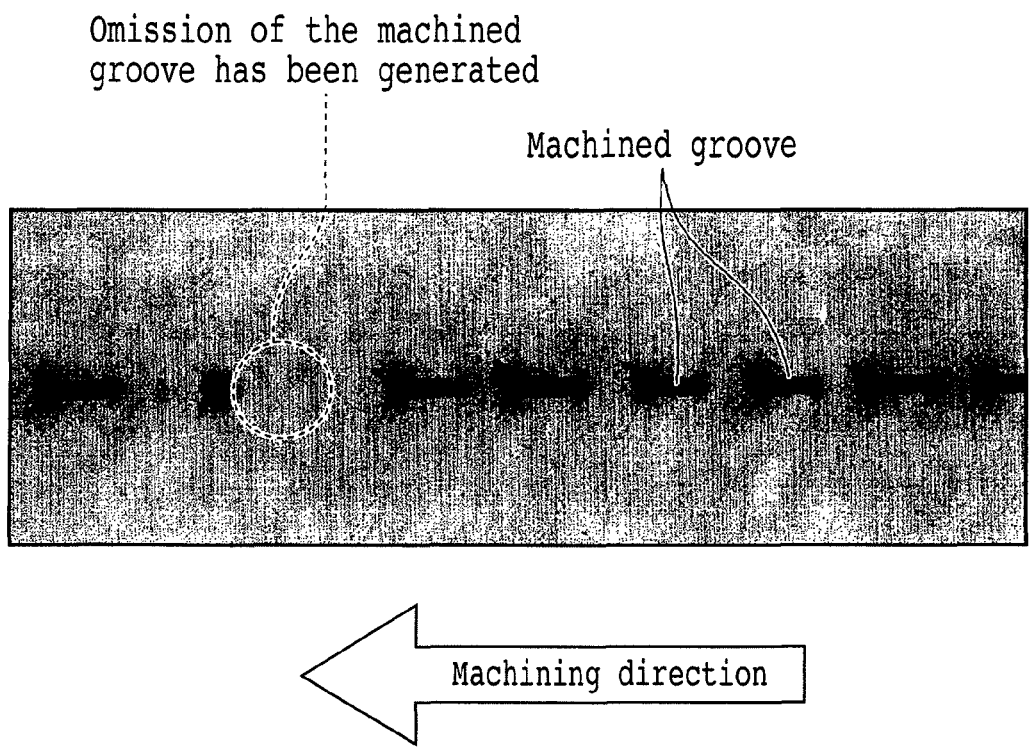
FIG. 11 is an electron microphotograph showing a situation in which omission of a machined groove has been generated.

With the wafer 1 thus broken up along the first and second streets 4 and 5 so as to be divided into the individual devices 6, chips 6A are formed. FIG. 10 is a perspective view of the chip formed by dividing the wafer. As shown in FIG. 10, the chip 6A has a structure in which once-melted layers 210a and 211a corresponding respectively to the machined grooves 210 and the shallow grooves 211 produced by irradiation with the laser beam in the machining step are remaining at upper portions of sectional side surfaces where the wafer 1 has been broken. However, the once-melted layers 210a and 211a are respectively about 25 to 20 μm and about 5 to 7 μm in thickness, which are small as compared with the area of the section of the chip 6A. Therefore, even where the chip 6A is a light emitting diode (LED), the lowering in the luminance is so slight as not to influence the quality of the chip 6A.

The present invention is not limited to the above-mentioned embodiments, and various modifications are possible without departing from the gist of the invention. For instance, while the ON/OFF ratio of one pulse is regulated by the Q switch 37b and the output of the pulsed laser beam is varied in magnitude for the purpose of alternately and continuously forming the machined grooves 210 and the shallow grooves 211 in the present embodiment, other systems may also be adopted insofar as the irradiation energy per unit time for the machining areas G is different from that for the machining start point areas H. For example, an AOD, AOM or the like utilizing an acousto-optic effect or an attenuator may be disposed in the transmission optical system 38 to vary the output of the pulsed laser beam for irradiation therewith between the machining area G and the machining start point area H. Or, alternatively, the scanning speed of the irradiation point P for the machining areas G may be set different from that for the machining start point areas H.

Besides, the steps ranging from the setting step to the machining step as above-mentioned may be treated or carried out in the following procedure:

(1) To set the machining areas in which to form the machined grooves and the machining start point areas in which to form the shallow grooves, along each of the streets;

(2) To store the machining areas and the machining start point areas set in (1) above on a work basis and the position of each of the streets into a storage area;

(3) To recognize the position and orientation of the work on the holding means by alignment; and (4) To perform machining for continuously forming the machined grooves and the shallow grooves, based on the information stored in the storage area in (2) above and the status (position, orientation) of the work recognized in (3) above.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser beam machining method for machining a transparent substrate of a wafer through ablation by irradiation with a laser beam, the wafer having a functional layer formed on a surface of the transparent substrate and having devices formed respectively in a plurality of regions demarcated by a plurality of streets arranged in a grid pattern on the surface, the method comprising:

a holding step of holding the wafer;

a setting step of alternately setting in each of the streets machining areas in which to form machined grooves and machining start point areas in which to form shallow grooves shallower than the machined grooves, and storing the setting information in a storage section; and a machining step of continuously forming the machined grooves and the shallow grooves by scanning an irradiation point of the laser beam from one end toward the other end of each of the streets, based on the setting information stored in the storage section.

2. The laser beam machining method according to claim 1, wherein the machining step comprises continuously forming the machined grooves and the shallow grooves by scanning the irradiation point of the laser beam from the one end toward the other end of each of the streets while varying the output power of the laser beam.

3. The laser beam machining method according to claim 1, wherein the transparent substrate comprises a sapphire substrate, the functional layer includes a nitride semiconductor layer, and the device is a light emitting diode.

4. The laser beam machining method according to claim 1, wherein the machining areas are set in areas each including an intersection position of the plurality of streets arranged in the grid pattern.

5. The laser beam machining method according to claim 1, wherein the ratio of the length of the machining area to the length of the machining start point area is set in the range of from 1:1 to 2:1.

6. The laser beam machining method according to claim 1, wherein the depth of the machined grooves is set in the range of 15 to 25 μm.

* * * * *